United States Patent
Wu et al.

(10) Patent No.: US 6,444,511 B1
(45) Date of Patent: Sep. 3, 2002

(54) CMOS OUTPUT CIRCUIT WITH ENHANCED ESD PROTECTION USING DRAIN SIDE IMPLANTATION

(75) Inventors: Yi-Hsu Wu, Hsin-Chu; Hung-Der Su, Kao-Hsiung; Jian-Hsing Lee, Hsin-Chu; Boon-Khim Liew, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/867,562

(22) Filed: May 31, 2001

(51) Int. Cl.$^7$ .......................................... H01L 21/8238
(52) U.S. Cl. ........................ 438/199; 438/306; 438/232
(58) Field of Search .................................. 438/275–278, 438/199, 301–306, 232

(56) References Cited

U.S. PATENT DOCUMENTS

| | | | | |
|---|---|---|---|---|
| 5,416,351 A | * | 5/1995 | Ito et al. ..................... | 257/357 |
| 5,559,352 A | | 9/1996 | Hsue et al. .................. | 257/328 |
| 5,870,268 A | | 2/1999 | Lin et al. .................... | 361/111 |
| 5,898,205 A | | 4/1999 | Lee ............................. | 257/355 |
| 5,918,127 A | * | 6/1999 | Lee et al. .................... | 438/278 |
| 6,066,879 A | | 5/2000 | Lee et al. .................... | 257/355 |

* cited by examiner

*Primary Examiner*—Jey Tsai
(74) *Attorney, Agent, or Firm*—George O. Saile; Stephen B. Ackerman; Douglas R. Schnabel

(57) ABSTRACT

A new cascaded NMOS transistor output circuit with enhanced ESD protection is achieved. A driver PMOS transistor has the source connected to a voltage supply, the gate connected to the input signal, and the drain connected to the output pad. A dummy PMOS transistor has the source and the gate connected to the voltage supply, and the drain connected to the output pad. A driver NMOS cascaded stack comprises first and second NMOS transistors. The first NMOS transistor has the source connected to ground and the gate connected to the input signal. The second NMOS transistor has the gate connected to the voltage supply, the source connected to the first NMOS transistor drain, and the drain connected to the output pad. A p– implanted region underlies the n+ region of the drain but does not underlie the n+ region of the source. A dummy NMOS cascaded stack comprises third and fourth NMOS transistors. The third NMOS transistor has the gate and the source connected to ground. The fourth NMOS transistor has the gate connected to the voltage supply, the source connected to the third MOS transistor drain, and the drain connected to the output pad. A p– implanted region underlies the n+ region of the drain but does not underlie the n+ region of the source.

12 Claims, 5 Drawing Sheets

US 6,444,511 B1

CMOS OUTPUT CIRCUIT WITH ENHANCED ESD PROTECTION USING DRAIN SIDE IMPLANTATION

BACKGROUND OF THE INVENTION (1) Field of the Invention

The invention relates to a device and a method of fabrication thereof for electrostatic discharge (ESD) protection, and more particularly, to a novel output circuit for use in a CMOS integrated circuit device.

(2) Description of the Prior Art

As device dimensions continue to be reduced, susceptibility to electrostatic discharge (ESD) damage is a growing concern. ESD events occur when charge is transferred between one or more pins of an integrated circuit and another conducting object in a short period of time, typically less than one microsecond. The rapid charge transfer generates voltages large enough to breakdown insulating films, such as silicon dioxide, and to cause permanent damage to the device. To deal with the problem of ESD events, integrated circuit manufactures have designed various structures on the input and output pins of their devices to shunt ESD currents away from sensitive internal structures.

Referring now to FIG. 1, a prior art CMCS output circuit is illustrated. In this circuit, an internal circuit voltage, SIGNAL 20, is propagated to an output pin, PAD 24. A driver stage inverter is made up of NMOS transistor N1 8 and PMOS transistor P1 4. The output of the driver stage is tied directly to the output PAD 24. In addition, two protection devices, N2 and P2, are used in a dummy stage. An NMOS device, N2 16, and a PMOS device P2 12, are each connected with zero gate bias such that each device is OFF during normal operating conditions. However, if a negative voltage spike occurs at PAD 24, then the dummy stage protection devices turn ON and shunt current to either ground 28 or to the supply voltage (VCC) 32. In addition, if a large positive voltage spike occurs at PAD 24, then the diodes formed by the drain to substrate junctions of N2 and P2 will forward bias and provide a current shunt.

Referring now to FIG. 2, a cross sectional view of an integrated circuit incorporating a portion of the circuit is shown. The two NMOS devices, N1 and N2, are formed. Gates for N1 60 and for N2 64 are formed by patterning a polysilicon layer overlying silicon dioxide 72. The gates 60 and 64 overlie the semiconductor substrate 40 to form a channel region for each transistor. The drain and source regions comprise the n+ implanted areas 44, 48, and 52. Silicide 56 may be formed in the drain and source prior to deposition of the metal layer 68. Note that a p− region 76 is implanted under both the source 44 and 52 and drain 48 regions of both devices.

Referring again to FIG. 1, a problem with the prior art device is that the voltage at the output PAD must be kept very low. This is because the entire voltage differential between PAD 24 and ground 28 is across the gate dielectric of the NMOS device N2 16. In devices with gate lengths of about 0.18 microns, it is found that the very thin gate oxide used can breakdown at about 5 Volts. This can limit the application of these integrated circuit devices.

Several prior art inventions describe ESD devices and circuits. U.S. Pat. No. 5,898,205 to Lee teaches an ESD protection circuit where conventional CMOS protection transistors are capacitively-coupled to improve performance. U.S. Pat. No. 6,066,879 to Lee et al discloses a method to form an ESD device where a SCR protection device and an NMOS or DENMOS transistor are integrated. U.S. Pat. No. 5,870,268 to Lin et al teaches a transient switching circuit that forward biases a n+/p-well diode to cause minority carrier injection into the substrate. U.S. Pat. No. 5,559,352 to Hsue et al teaches a method to form an ESD device with a reduced breakdown voltage. A deep ion implantation is performed in both the source and drain regions to reduce the breakdown voltage.

SUMMARY OF THE INVENTION

A principal object of the present invention is to provide an effective and very manufacturable output circuit that protects a CMOS integrated circuit from electrostatic discharge (ESD) events.

A further object of the present invention is to provide an output circuit that can withstand larger dc voltages on the output pin by cascading NMOS transistors.

A still further object of the present invention is to provide an output circuit with cascaded NMOS transistors and with enhanced ESD performance through the use of a p-implanted region under the drain.

Another object of the present invention is to provide an effective and very manufacturable method to fabricate a cascaded NMOS transistor output circuit with enhanced ESD performance in a CMOS integrated circuit device.

In accordance with the objects of this invention, a new cascaded NMOS transistor output circuit with enhanced ESD protection is achieved. A driver PMOS transistor has the source connected to a voltage supply, the gate connected to the input signal, and the drain connected to the output pad. A dummy PMOS transistor has the source and the gate connected to the voltage supply, and the drain connected to the output pad. A driver NMOS cascaded stack comprises first and second NMOS transistors. The first NMOS transistor has the source connected to ground and the gate connected to the input signal. The second NMOS transistor has the gate connected to the voltage supply, the source connected to the first NMOS transistor drain, and the drain connected to the output pad. A p− implanted region underlies the n+ region of the drain but does not underlie the n+ region of the source. A dummy NMOS cascaded stack comprises third and fourth NMOS transistors. The third NMOS transistor has the gate and the source connected to ground. The fourth NMOS transistor has the gate connected to the voltage supply, the source connected to the third MOS transistor drain, and the drain connected to the output pad. A p− implanted region underlies the n+ region of the drain but does not underlie the n+ region of the source.

Also in accordance with the objects of this invention, a method to fabricate a cascaded NMOS transistor output circuit with enhanced ESD protection is achieved. N-type regions and p-type regions are provided in a semiconductor substrate. A gate oxide layer is formed overlying the semiconductor substrate. A polysilicon layer is deposited overlying said gate oxide layer. The polysilicon layer is patterned to form transistor gates for NMOS and PMOS output transistors. Ions are implanted into the semiconductor substrate to form n+ regions for NMOS output transistor drains and sources and to form p+ regions for PMOS output transistor drains and sources. Ions are implanted into the semiconductor substrate to form p− implanted regions underlying the n+ regions of the NMOS output transistor drains. The implanting is selective to only the NMOS output transistor drains connected to planned output pads. An interlevel dielectric layer is deposited overlying the NMOS and PMOS output transistors. The interlevel dielectric layer is patterned to form contact openings. A metal layer is deposited overlying the interlevel dielectric layer and filling the contact openings. The metal layer is patterned to complete the NMOS and PMOS output transistors in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The preferred embodiment discloses the application of the device of the present invention to ESD protection for an integrated circuit device. In addition, a method of fabrication is disclosed. It should be clear to those experienced in the art that the present invention can be applied and extended without deviating from the scope of the present invention.

Figure 1:
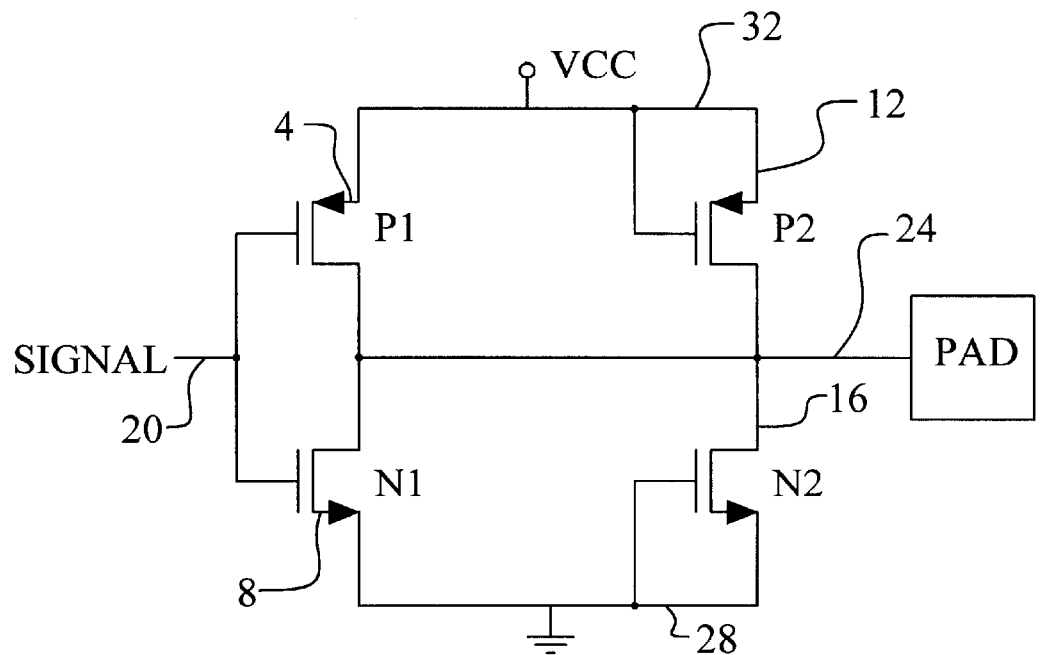
FIG. 1 illustrates a prior art output circuit with ESD protection devices.
Figure 2:
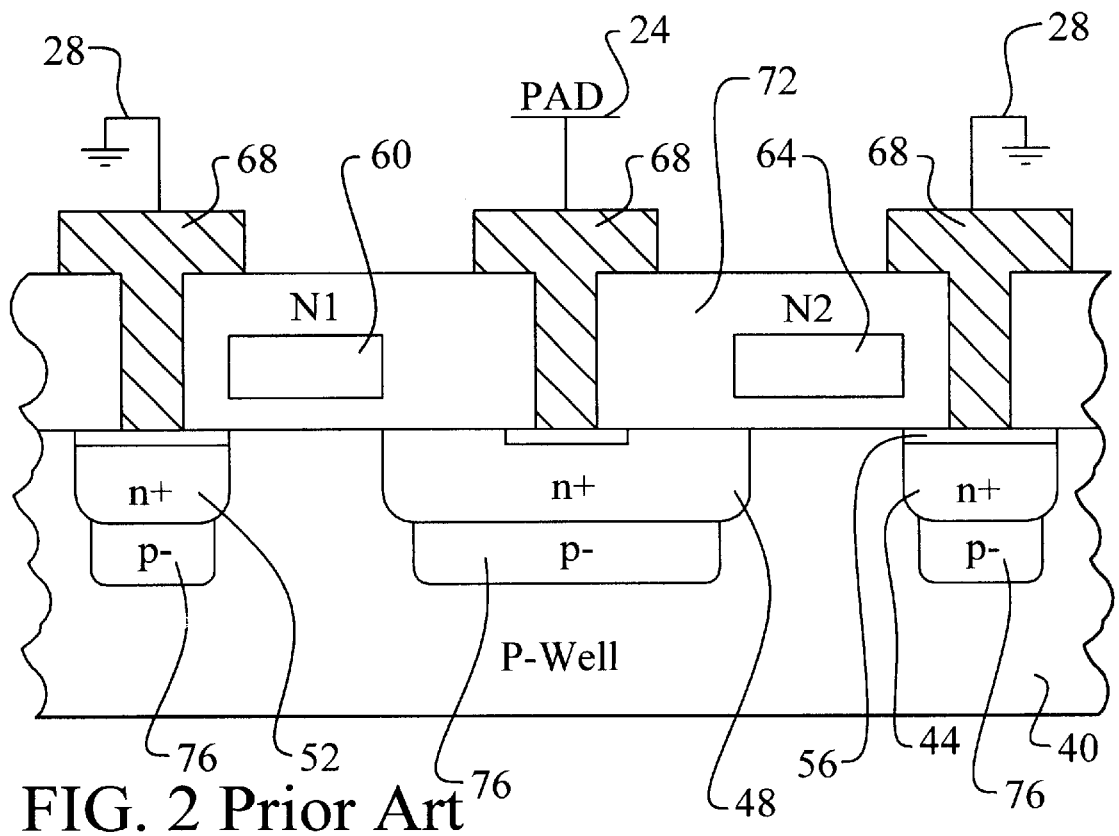
FIG. 2 illustrates in cross section a prior art ESD protection device.
Figure 3:
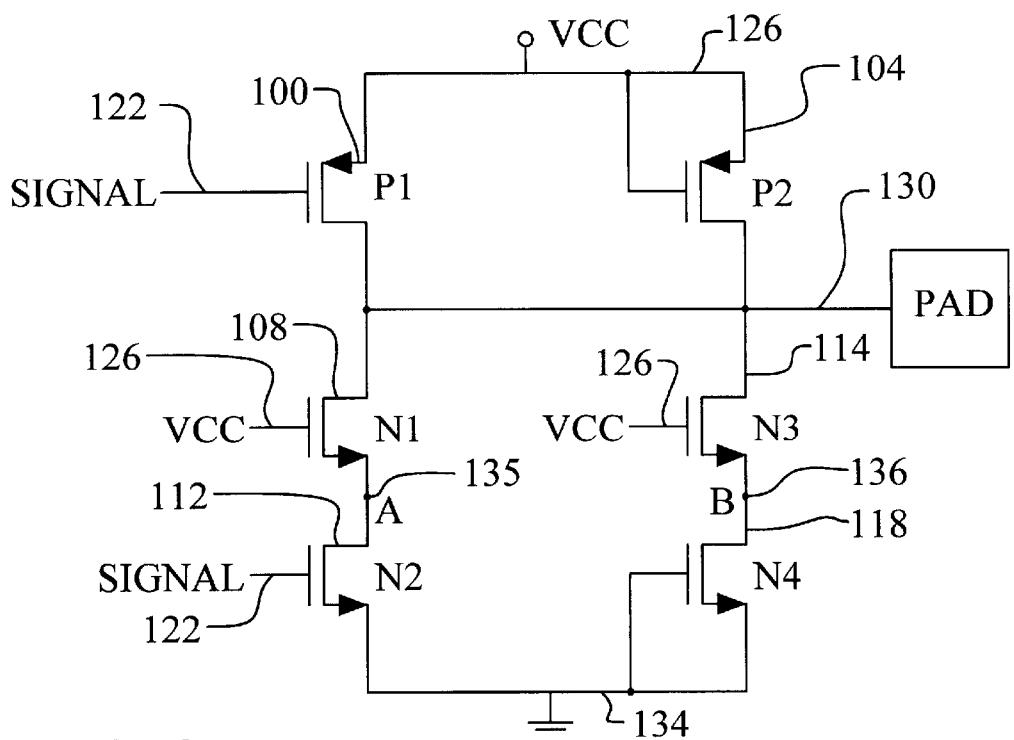
FIG. 3 illustrates the preferred embodiment of the cascaded NMOS output circuit.

Referring now particularly to FIG. 3, there is shown a schematic of the preferred embodiment of the cascaded NMOS output circuit of the present invention. Several important features of the present invention are shown in this illustration. The circuit translates SIGNAL 122 from an internal voltage to an output voltage at the PAD 130. The circuit provides current to drive the external loading attached to the PAD output 130. The circuit protects the devices from gate breakdown during normal operation. Finally, the circuit provides enhanced ESD protection that protects the internal MOS devices.

In the preferred embodiment, the integrated circuit onto which the present invention is applied comprises a low voltage, digital device. The minimum transistor lengths of this digital device are about 0.18 microns. Therefore, the internal voltages must be kept low. For example, the VCC voltage 126 is between about 3.0 Volts and 3.6 Volts. However, the output circuit of the present invention is connected directly to the output PAD 130. This output PAD may see dc voltages as high as about 5 Volts. This voltage may exceed the gate oxide breakdown of the thin oxide used for the low voltage devices.

To resolve the gate oxide breakdown problem, the novel circuit of the present invention uses cascaded NMOS stacks to divide the excessive voltage at the PAD 130 across two devices. The driver cascade comprises NMOS transistors N1 108 and N2 112. The dummy cascade comprises NMOS transistors N3 114 and N4 118. Consider the situation when VCC 126 is about 3.3 Volts while the PAD 130 voltage is about 5 Volts. The presence of the NMOS device N1 with gate voltage at VCC causes the voltage at node A 135 to be clamped at VCC-$V_t$ or about 2.4 Volts if $V_t$ (voltage threshold) is about 0.7 Volts. This means that the voltage across the gate oxide of N2 135 is clamped to about 2.4 volts in the worst case when SIGNAL 122 is at 0 Volts. In addition, the voltage across the gate oxide of N1 108 is only about 5–3.3 Volts or 1.7 Volts. Therefore, the driver cascaded NMOS configuration prevents overstress or breakdown of the gate oxide of NMOS transistors N1 and N2 during normal operating conditions. The same analysis holds for the dummy cascaded NMOS transistors N3 114 and N4 118.

The complete connectivity of the circuit is described below. A first PMOS transistor 100, labeled P1, has the source connected to the internal voltage supply VCC 126. The drain of P1 is connected to the output PAD 130, and the gate of P2 is connected to SIGNAL 122. A second PMOS transistor 104, labeled P2, has the source and the gate connected to VCC 126 and the drain connected to PAD 130. A first NMOS transistor 108, labeled N1, has the drain connected to PAD 130 and the gate connected to the voltage supply VCC 126. A second NMOS transistor 112, labeled N2, has the source connected to ground 134 and the gate connected to the input SIGNAL 122. The drain of N2 and the source of N1 are connected together to form the intermediate node A 135. A third NMOS transistor 114, labeled N3, has the drain connected to PAD 130 and the gate connected to VCC 126. A fourth NMOS transistor 118, labeled N4, has the gate and the source connected to ground 134. The source of N3 and the drain of N4 are connected together to form the intermediate node B 136.

During normal operation, the circuit functions as an inverter output. When SIGNAL 122 is at a low voltage level of about 0 Volts, the first PMOS transistor P1 100 is ON and the second NMOS transistor N2 112 is OFF. Therefore, the PAD voltage is pulled up to VCC. The second PMOS transistor P2 104 and the fourth NMOS transistor N4 118 are always OFF. Therefore, the second stage of the circuit plays no role during normal operation. If SIGNAL 122 transitions to a high voltage level of about 3.3 Volts, then P1 100 turns OFF and N2 112 turns ON. The output 130 is then pulled low through N2 and the NMOS pass Transistor N1 108.

During an ESD event, a large voltage spike may occur on the PAD pin 130. A voltage pulse of about several thousand kilovolts may occur for about a microsecond. During an ESD event, the novel cascaded NMOS circuit will protect internal circuits from the potentially destructive energy by providing a low impedance path either to ground 134 or to VCC 126.

For example, a large positive voltage spike on PAD 130 will be propagated to the n-side of the p-n junction formed by the substrate (p−) and the drains (n+) of the first NMOS transistor N1 108 and of the third NMOS transistor N3 114. When the voltage of the spike exceeds the breakdown voltage of the reverse biased p-n junction, current will begin to flow into the substrate. This substrate current will cause the substrate voltage to rise as given by:

$$V_{be}=I_{sub} \times R_{sub},$$

where $I_{sub}$ is the substrate current, $R_{sub}$ is the substrate resistance, and $V_{be}$ is the voltage potential across the parasitic npn base-to-emitter junction formed by the substrate (p−) and the sources (n+) of the second NMOS transistor N2 112 and of the fourth NMOS transistor N4 118. When $V_{be}$ rises to the npn threshold of about 0.7 Volts, the parasitic npn transistor turns ON. The ESD energy on the PAD pin 130 is then shunted to the ground connection 134, and the voltage is clamped at a safe value.

Figure 4:
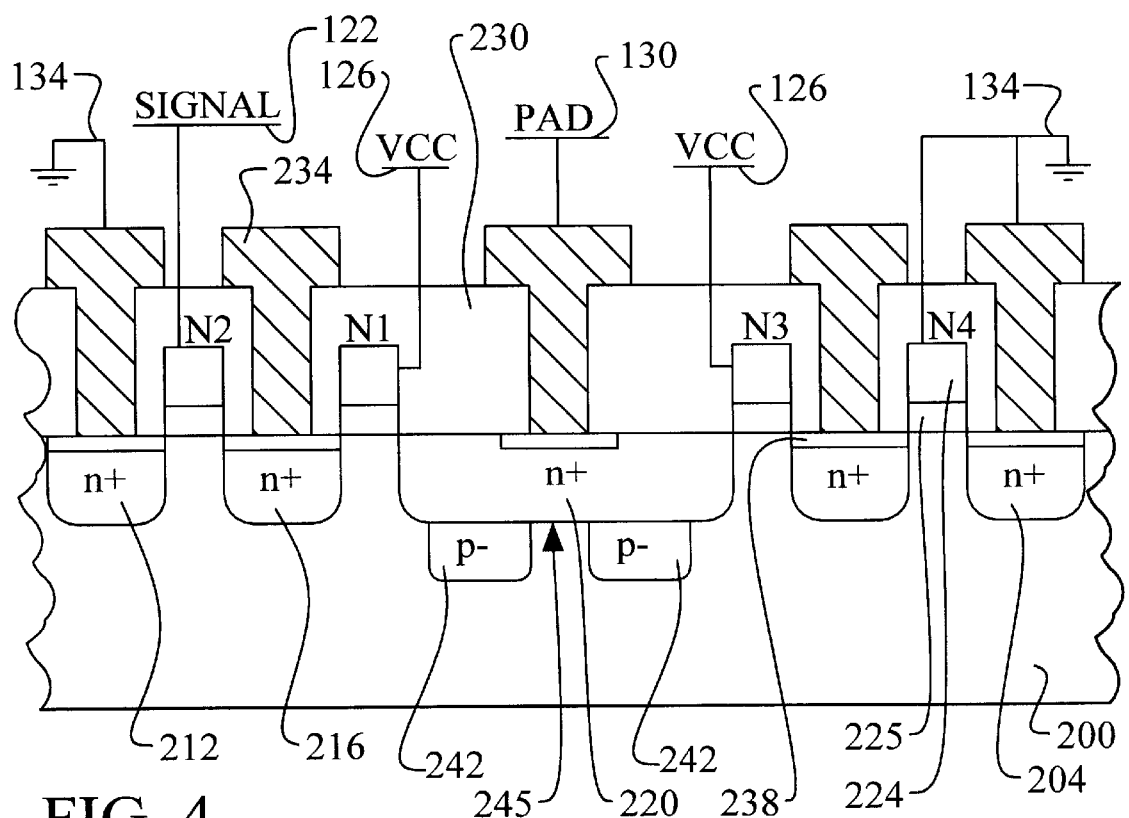
FIG. 4 Illustrates in cross section the cascaded NMOS devices of the preferred embodiment.

Referring now to FIG. 4, several important features of the novel physical structure of the present invention are illustrated. In particular, FIG. 4 shows a cross section of an integrated circuit device wherein the circuit of the present invention is fabrication. The cross section illustrates the driver cascaded NMOS devices, N1 and N2, and the dummy cascaded NMOS device, N3 and N4.

A semiconductor substrate 200 preferably comprises monocrystalline silicon. In the preferred embodiment, n-wells and p-wells are formed in the semiconductor substrate 200. This cross section shows a region of the semiconductor substrate 200 that has been doped p-type to form a p-well 200. The p-well 200 preferably comprises a dopant concentration of between about $5 \times 10^{16}$ atoms/cm$^3$ and $1 \times 10^{19}$ atoms/cm$^3$.

Several n+ source and drain regions 212, 216, 220, 208, and 204 are formed in the p-well substrate region 200. The n+ source and drain regions 212, 216, 220, 208, and 204 are preferably formed with a dopant concentration of between about $5 \times 10^{19}$ atoms/cm$^3$ and $5 \times 10^{21}$ atoms/cm$^3$ and a depth of between about 0.07 microns and 0.25 microns. Transistor gates N1, N2, N3, and N4 are preferably formed from a polysilicon layer 224 overlying a gate oxide layer 225. The drains and sources of the transistors are connected as shown in the circuit schematic of FIG. 3 through the metal layer 234. An interlevel dielectric layer 230 isolates metal lines 234 from the transistors. A silicide layer 238 may be used to reduce contact resistance and improve performance. It is important that the silicide layer 238 coupled to the output pad 130 be spaced from the polysilicon gates 224.

Of particular importance to the present invention is the presence of the p– implanted regions 242 only under the common n+ drain region 220 of the driver NMOS transistor N1 and the dummy NMOS transistor N3. The p– implanted regions 242 are vital to the present invention. The p– implanted regions 242 have a higher doping concentration than the surrounding p-well semiconductor substrate 200. Therefore, the p– implanted regions 242 create a sharper p-n junction gradient than would exist between the n+ drain and the substrate 200.

The sharper p-n junction gradient decreases the reverse breakdown voltage ($V_{BD}$) of the junction. Therefore, the junction begins conducting current into the substrate at a lower reverse voltage during the ESD event. In addition, the sharper p-n junction gradient increases the junction capacitance ($C_j$). Transient energy from the ESD event is propagated into substrate current due to junction capacitance as given by:

$$I_{sub} = C_j \, dV/dt.$$

Therefore, the substrate current increases as the junction capacitance increases. This combination of decreased breakdown voltage and increased junction capacitance, due to the presence of the p– implanted regions 242, causes the parasitic npn transistor to turn ON faster.

Another important feature of the present invention is the fact that the p– implanted regions only underlie the common drain 220 that is connected to the PAD 130. The drain and source regions 212, 216, 208, and 204 of the cascaded NMOS structures that are not connected to the PAD 130 do not have the p– implanted region underlying the n+ region. This feature is important to the present invention because the higher reverse breakdown voltage ($V_{BD}$) of the p-n junctions formed by the n+ regions and the p-well substrate 200 are thereby maintained.

Yet another feature of the present invention is the absence of any p– implanted region 242 underlying the contact openings 245 for the PAD common drain 220. By not forming the p– implanted region underlying the contact openings 245, the reverse bias current during an ESD event is focused away from the area immediately below the contacts. This reduces the likelihood of metal spiking through the contact opening and into the underlying substrate 200.

The p– implanted regions 242 are preferably formed underlying the common drain 220 at a doping concentration of between about $1 \times 10^{17}$ atoms/cm$^3$ and $5 \times 10^{19}$ atoms/cm$^3$ and a junction depth of between about 0.1 microns and 0.3 microns.

Figure 5:
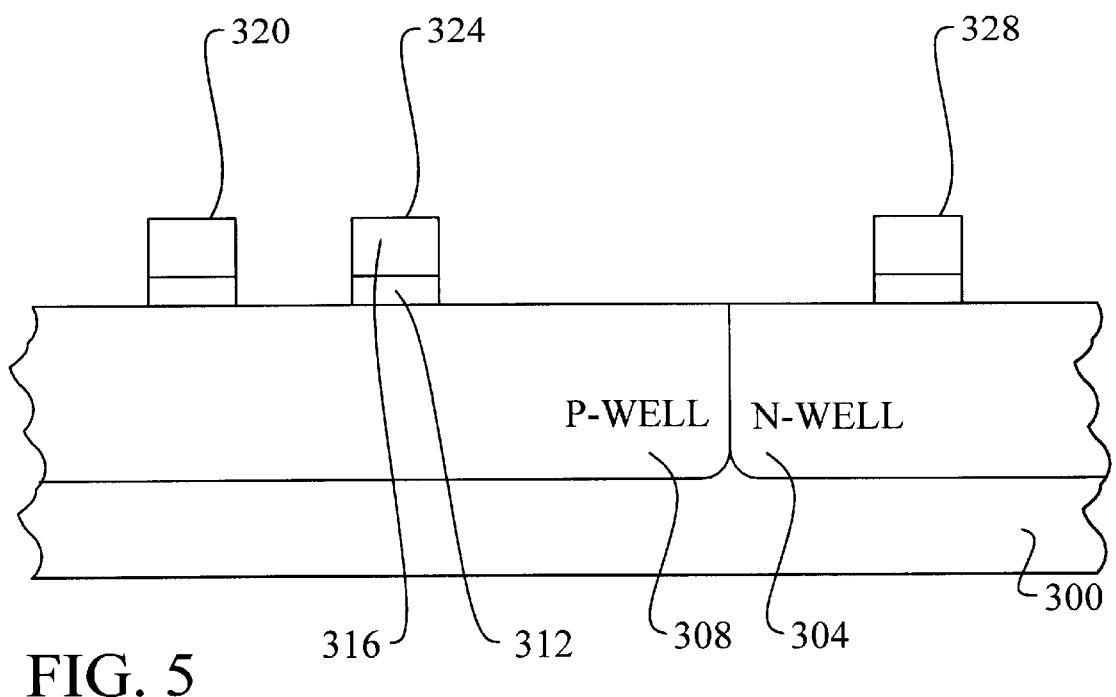
FIGS. 5 through 7 and FIG. 9 illustrates in cross section the preferred embodiment of the method of fabrication.

Referring now to FIG. 5, the preferred method of fabricating the CMOS output circuit of the present invention is illustrated. A semiconductor substrate 300 is provided. N-type regions 304, or n-wells 304, and p-type regions 308, or p-wells 308, are formed in the semiconductor substrate. The n-wells 304 and p-wells 308 may be formed by, for example, a process of implanting ions into the substrate 300 and driving these ions deeper into the substrate using a thermal operation. The PMOS transistors are formed in the n-wells 304. The NMOS transistors are formed in the p-wells 308.

A gate oxide layer 312 is formed overlying the semiconductor substrate 300. The gate oxide layer 312 will form the gate insulator for the MOS transistors of the circuit. The gate oxide layer 312 may be formed by thermal oxidation of the substrate surface or by chemical vapor deposition (CVD). The gate oxide layer 312 is preferably formed to a thickness of between about 10 Angstroms and 300 Angstroms. A polysilicon layer 316 is deposited overlying the gate oxide layer 312. The polysilicon layer 316 may be doped or undoped. The polysilicon layer 316 is deposited by, for example, a CVD process to a preferred thickness of between about 1,000 Angstroms and 3,000 Angstroms. The polysilicon layer 316 is then patterned to create the gates for the NMOS and PMOS transistors. In the particular cross section of FIG. 5, the gate 328 of a PMOS transistor 328 and the gates of two NMOS transistors 320 and 324 are formed. The drain of NMOS transistor 324 will be connected to the output, while the drain of NMOS transistor 320 will not be connected to the output.

Figure 6:
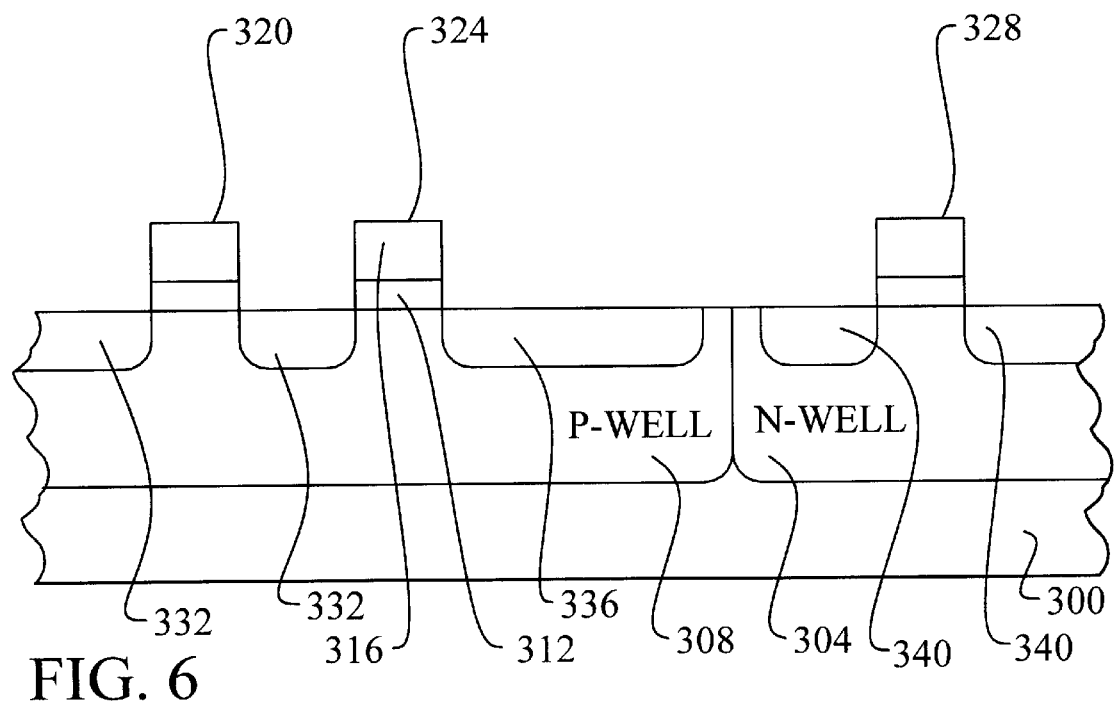

Referring now to FIG. 6, ions are implanted into the semiconductor substrate 30 to form n+ regions 332 and 336 for the NMOS transistors and p+ regions 340 for the PMOS transistor. Two implantation steps are used. In one implantation step, a n+ mask, not shown, is formed overlying the semiconductor substrate. Openings in the n+ mask reveal areas in the substrate where ion implantation is desired. The Ion implantation to form the n+ regions is then performed with a preferred dose of between about $1 \times 10^{15}$ atoms/cm$^2$ and $3 \times 10^{16}$ atoms/cm$^2$ and energy of between about 20 KeV and 100 KeV. N+ regions formed for NMOS drains and sources that will not be connected to the output pad are labeled 332. N+ regions formed for NMOS drains that will be connected to the output pad are labeled 336. The process used for the n+ implantation is repeated for the p+ implantation. A p+ mask is used to reveal only those areas in the substrate where p+ regions should be formed. The p+ ion implantation is preferably performed using a dose of between about $1 \times 10^{15}$ atoms/cm$^2$ and $3 \times 10^{16}$ atoms/cm$^2$ and energy of between about 2 KeV and 50 KeV.

Figure 7:
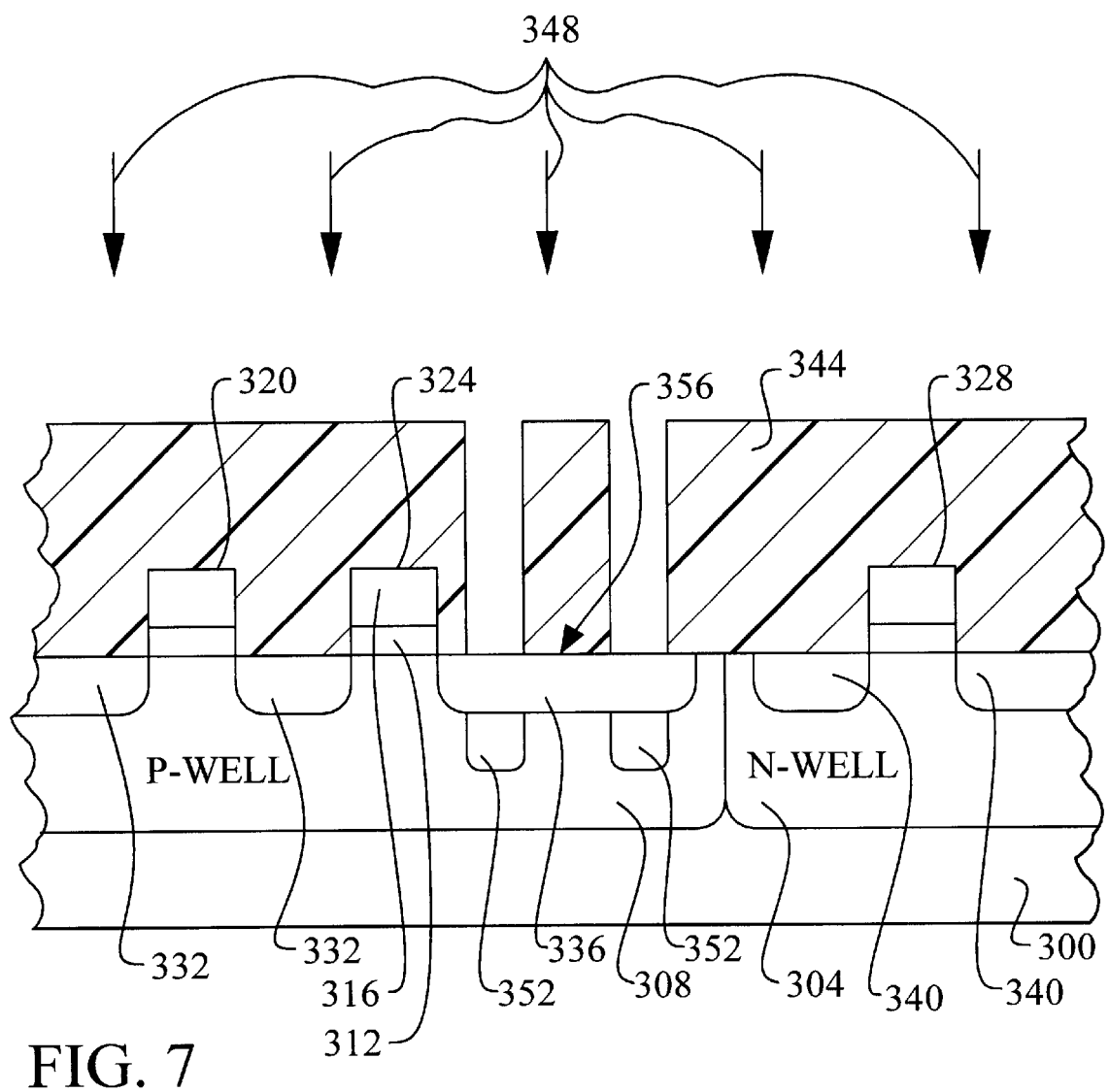

Referring now to FIG. 7, several important features of the present invention are illustrated. A p– implantation mask layer 344 is formed overlying the semiconductor substrate 300. This mask layer 344 comprises, for example, a patterned photoresist layer 344. The mask layer 344 is patterned to form openings only overlying the drain region 336 that will be connected directly to the output pad. In addition, these openings in the mask layer 344 are restricted so as not to expose the part of the underlying drain 336 where contacts are planned 356.

Ions are implanted 348 into the semiconductor substrate 300 through the openings in the masking layer 344. The ion implantation forms p– implanted regions 352 in the semiconductor substrate 300 underlying the n+ drain regions 336 that will be connected to the output pads. As stated earlier, the presence of these p– implanted regions is critical to improving the ESD performance of the circuit. The ion implantation is preferably performed using a dose of between about $5\times10^{12}$ atoms/cm$^2$ and $5\times10^{14}$ atoms/cm$^2$ and energy of between about 20 KeV and 70 KeV.

Figure 8:
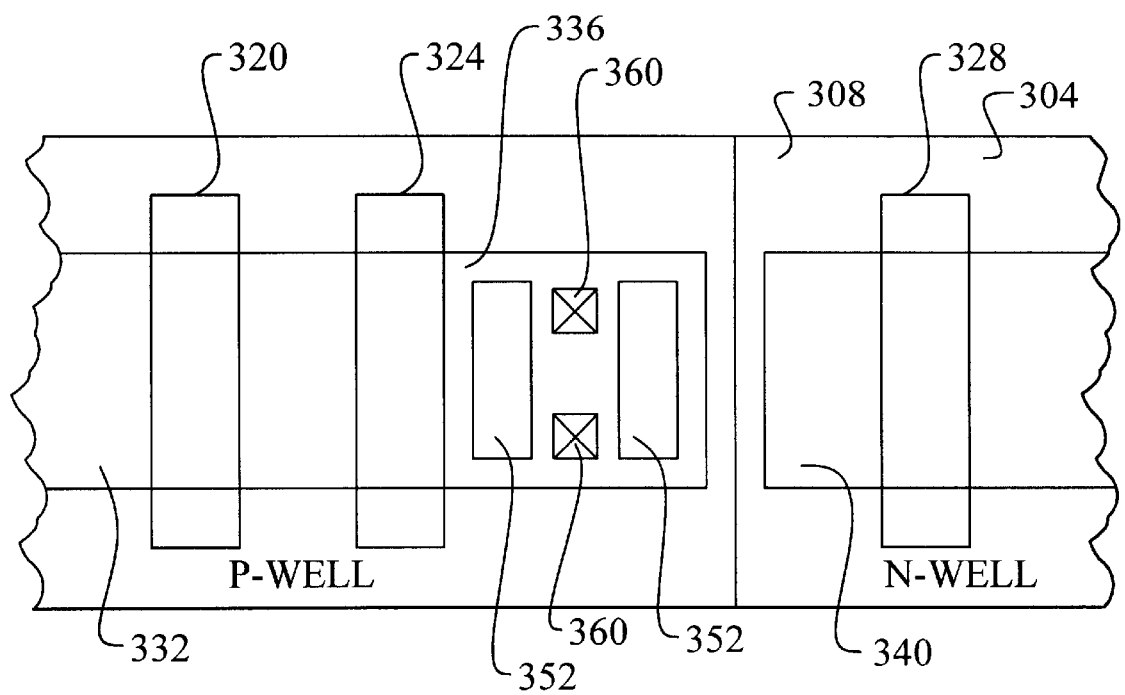
FIG. 8 illustrates in top view a step in the preferred embodiment of the method of fabrication.

Referring now to FIG. 8, a top view of the same layout is shown. In this view, the selective openings 352 in the masking layer are illustrated. Note that the three gates 320, 324 and 328 are formed by the polysilicon layer 316 crossing the n+ active areas 332 and 336 and the p+ active area 340. Note also that the NMOS drain that will be connected directly to the pad is shown as the n+ active area 336. The planned contact openings 360 are shown in this area. The openings 352 that expose the underlying drain region 336 for ion implantation. Notice that the mask layer is not opened where the contacts 360 are planned.

Figure 9:
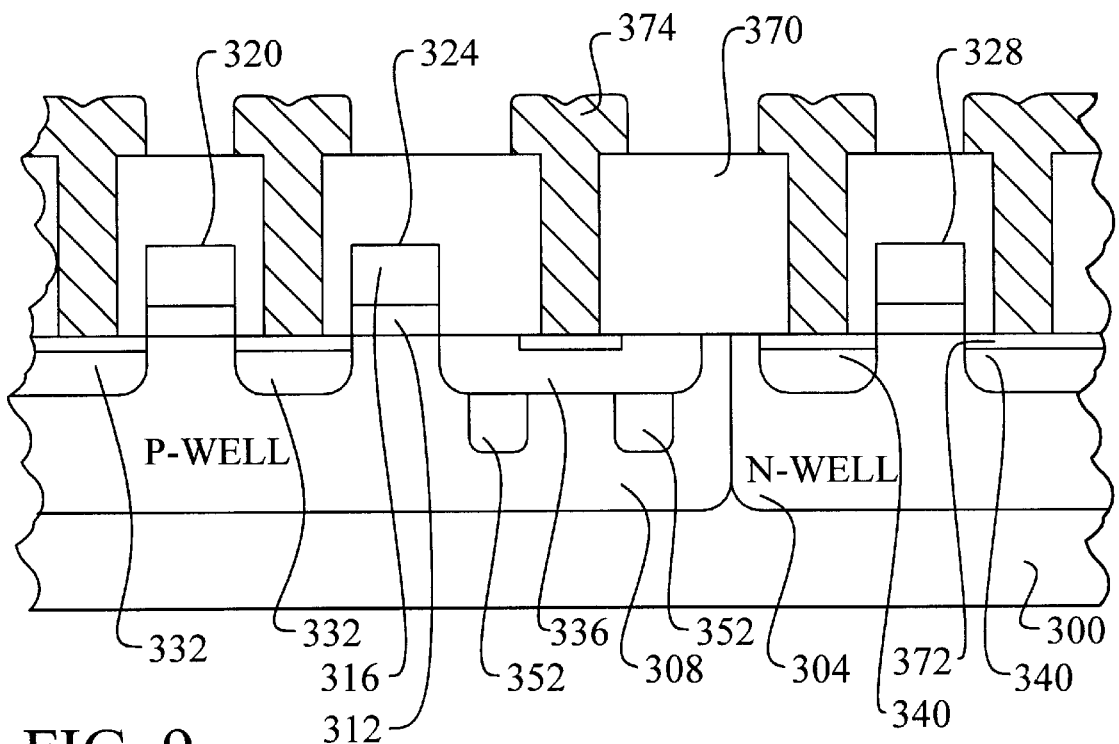

Referring now to FIG. 9, an interlevel dielectric layer 370 is deposited overlying the NMOS and PMOS transistor gates 320, 324, and 328. The interlevel dielectric layer may comprise any insulating material, such as silicon dioxide, that can insulate transistor devices from the subsequently formed metal lines 374. The interlevel dielectric layer 370 is then patterned to form the aforementioned contact openings where the metal layer 374 will directly contact the substrate 300. A silicide layer 372 may be formed in the drain and source regions if needed. A metal layer 374 is deposited and patterned to form metal lines and to complete the NMOS and PMOS transistors of the circuit.

The advantages of the present invention may now be summarized. First, a CMOS output circuit capable of withstanding high voltages on the output pin has been achieved. Second, novel cascaded NMOS structures are used to reduce the voltage exposure of the NMOS gate oxide. Third, a novel p– implanted region is formed underlying only the NMOS drains connected to the output pad. The p– implanted region reduces the reverse breakdown voltage while increasing the junction capacitance to thereby cause the parasitic npn device to turn ON more rapidly. The ESD protection capability of the circuit is enhanced. Without the p– implanted region, the ESD protection is capable only to 1,500 Volts. With the p– implanted region, the ESD protection is enhanced to 3,000 Volts. Finally, a very manufacturable method of fabricating the novel circuit device is also achieved.

As shown in the preferred embodiments, the novel protection circuit device and method of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a CMOS output circuit with enhanced ESD performance in the manufacture of an integrated circuit device comprising:

providing n-type regions and p-type regions in a semiconductor substrate;

forming a gate oxide layer overlying said semiconductor substrate;

depositing a polysilicon layer overlying said gate oxide layer;

patterning said polysilicon layer to form transistor gates for NMOS and PMOS output transistors;

implanting ions into said semiconductor substrate to form n+ regions for NMOS output transistor drains and sources and to form p+ regions for PMOS output transistor drains and sources;

implanting ions into said semiconductor substrate to form p– regions underlying said n+ regions of said NMOS output transistor drains wherein said implanting is selective to only said NMOS output transistor drains connected to planned output pads and wherein said ions are blocked from areas of said semiconductor substrate underlying planned contact openings;

depositing an interlevel dielectric layer overlying said NMOS and PMOS transistor gates;

patterning said interlevel dielectric layer to form said contact openings;

depositing a metal layer overlying said interlevel dielectric layer and filling said contact openings; and patterning said metal layer to complete said NMOS and PMOS output transistors in the manufacture of said integrated circuit device.

2. The method according to claim 1 wherein said gate oxide layer is formed to a thickness of between about 10 Angstroms and 300 Angstroms.

3. The method according to claim 1 wherein said step of implanting ions to form said n+ regions comprises a dose of between about $1\times10^{15}$ atoms/cm$^2$ and $3\times10^{16}$ atoms/cm$^2$ and an energy of between about 20 KeV and 70 KeV.

4. The method according to claim 1 wherein said step of implanting ions to form said p– regions comprises a dose of between about $5\times10^{12}$ atoms/cm$^2$ and $5\times10^{14}$ atoms/cm$^2$ and an energy of between about 20 KeV and 70 KeV.

5. The method according to claim 1 wherein said p– regions comprise a dopant concentration of between about $1\times10^{17}$ atoms/cm$^3$ and $5\times10^{19}$ atoms/cm$^3$ and a junction depth of between about 0.1 microns and 0.3 microns.

6. The method according to claim 1 further comprises forming a silicide layer in said drains and sources prior to said step of depositing said metal layer.

7. The method according to claim 1 wherein said NMOS output transistor drains connected to planned output pads comprise a common n+ region.

8. A method to form a CMOS output circuit with enhanced ESD performance in the manufacture of an integrated circuit device comprising:

providing n-type regions and p-type regions in a semiconductor substrate;

forming a gate oxide layer overlying said semiconductor substrate;

depositing a polysilicon layer overlying said gate oxide layer;

patterning said polysilicon layer to form transistor gates for NMOS and PMOS output transistors;

implanting ions into said semiconductor substrate to form n+ regions for NMOS output transistor drains and sources and to form p+ regions for PMOS output, transistor drains and sources;

implanting ions into said semiconductor substrate to form p– regions underlying said n+ regions of said NMOS output transistor drains wherein said implanting is selective to only said NMOS output transistor drains connected to planned output pads and wherein said ions are blocked from areas of said semiconductor substrate underlying planned contact openings;

depositing an interlevel dielectric layer overlying said NMOS and PMOS transistor gates;

patterning said interlevel dielectric layer to form said contact openings;

forming a silicide layer in said drains and sources;

depositing a metal layer overlying said interlevel dielectric layer and said silicide layer and filling said contact openings; and patterning said metal layer to complete said NMOS and PMOS output transistors in the manufacture of said integrated circuit device.

9. The method according to claim 8 wherein said gate oxide layer is formed to a thickness of between about 10 Angstroms and 300 Angstroms.

10. The method according to claim 8 wherein said step of implanting ions to form said n+ regions comprises a dose of between about $1 \times 10^{15}$ atoms/cm$^2$ and $3 \times 10^{16}$ atoms/cm$^2$ and an energy of between about 20 KeV and 70 KeV.

11. The method according to claim 8 wherein said step of implanting ions to form said p− regions comprises a dose of between about $5 \times 10^{12}$ atoms/cm$^2$ and $5 \times 10^{14}$ atoms/cm$^2$ and an energy of between about 20 KeV and 70 KeV.

12. The method according to claim 8 wherein said p− regions comprise a dopant concentration of between about $1 \times 10^{17}$ atoms/cm$^3$ and $5 \times 10^{19}$ atoms/cm$^3$ and a junction depth of between about 0.1 microns and 0.3 microns.

* * * * *